United States Patent [19]

Ikuina et al.

[11] Patent Number: 5,952,712
[45] Date of Patent: *Sep. 14, 1999

[54] PACKAGED SEMICONDUCTOR DEVICE AND METHOD OF MANUFACTURING THE SAME

[75] Inventors: Kazuhiro Ikuina; Yuzo Shimada; Kazuaki Utsumi, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/893,988

[22] Filed: Jul. 16, 1997

[30] Foreign Application Priority Data

Jul. 18, 1996 [JP] Japan .................................... 8-189240

[51] Int. Cl.⁶ .................................................. H01L 23/02
[52] U.S. Cl. .......................... 257/678; 257/686; 257/774; 257/777
[58] Field of Search ..................... 257/686, 774, 257/723, 725, 777, 678

[56] References Cited

U.S. PATENT DOCUMENTS

| | | | |
|---|---|---|---|
| 3,560,257 | 2/1971 | Schneble, Jr. et al. | 257/774 |
| 4,499,655 | 2/1985 | Anthony | 257/774 |
| 4,733,291 | 3/1988 | Levy et al. | 257/774 |
| 4,991,090 | 2/1991 | Bone et al. | 257/686 |
| 5,065,228 | 11/1991 | Foster et al. | 257/774 |
| 5,198,695 | 3/1993 | Hanes et al. | 257/774 |
| 5,229,647 | 7/1993 | Anadinger | 257/686 |
| 5,325,265 | 6/1994 | Turlik et al. | . |
| 5,386,142 | 1/1995 | Kurtz et al. | 257/774 |
| 5,399,898 | 3/1995 | Rostoker | 257/777 |
| 5,404,044 | 4/1995 | Booth et al. | 257/686 |
| 5,406,125 | 4/1995 | Johnson et al. | 257/774 |
| 5,530,288 | 6/1996 | Stone | 257/774 |
| 5,552,633 | 9/1996 | Sharma | 257/686 |
| 5,825,080 | 10/1998 | Imaoka et al. | 257/276 |

FOREIGN PATENT DOCUMENTS 0 575 813  12/1993  European Pat. Off. .
60068687    4/1985  Japan .

OTHER PUBLICATIONS

Linder S. et al. "Fabrication technology for wafer through-hole interconnections and three-dimensional stacks of chips and wafers" Proceeding of the workshop on micro electro mechanical systems (MEM, OISO, Jan. 25–28, 1994) No. Workshop 7.25 Jan. 1994, pp. 349–354, XP000528439, Institute of electrical and electronics engineers.

*Primary Examiner*—Nathan K. Kelley
*Attorney, Agent, or Firm*—Whitham, Curtis & Whitham

[57] ABSTRACT

A packaged semiconductor device includes an LSI chip, a chip size package integrally bonded to the LSI chip to mount and hold the LSI chip thereon in order to connect an electrode of a board on which the LSI chip is to be mounted and an electrode of the LSI chip to each other, an electrode formed on a surface of the package opposite to a surface thereof which is bonded to the LSI chip, so as to be connected to the electrode of the board, at least one through hole formed to extend through the LSI chip and the package, and a connecting conductor formed to extend through the through hole in order to connect the electrode of the package and the electrode of the LSI package to each other.

13 Claims, 3 Drawing Sheets

PACKAGED SEMICONDUCTOR DEVICE AND METHOD OF MANUFACTURING THE SAME

BACKGROUND OF THE INVENTION

1. Field of the Invention

The present invention relates to a packaged semiconductor device in which a package for mounting high-speed LSI elements at a high density is made of glass or a ceramic, and a method of manufacturing the same.

2. Description of the Prior Art

For a future multimedia society, a demand for smaller, higher-speed electronic apparatuses and systems is becoming more and more intense, as is represented by personal computers and portable telephones. In addition, a demand in recent years for a lower cost is very strict.

In order to solve these problems, the semiconductor chips themselves are highly integrated at a high density, as a matter of course. Also, a chip packaging method and a mounting technique concerning how to mount packaged chips on a board become important.

In the manufacture of semiconductor chips and LSIs, development of the micropatterning technique as well as an increase in diameter of the wafer are the most significant techniques to decrease the cost. Development of wafers having a diameter of 8 to 12 inches and furthermore 16 inches has been started.

Concerning chip packaging, as the integration degree increases, the number of I/O connection points increases accordingly. Thus, in the conventional DIP and QFP structures, connection between the leads and the board has become difficult to perform. If a chip package is forced to have the DIP or QFP structure, the package size becomes very large compared to the chip size. Then, not only the mounting efficiency is degraded, but also the parasitic L and C components in the lead portion adversely affect a high-speed chip.

In order to solve these problems, a technique has been developed with which a chip is not packaged but is connected in a bare state to a board without using leads. When chip-side electrodes and board-side electrodes are connected to each other in a point contact manner through solder balls or Au bumps, two-dimensional planar connection rather than conventional one-dimensional linear connection becomes possible, thus remarkably improving the mounting performance. This technique is called leadless chip (LLC) connection or flip-chip (FC) connection.

As described above, as a means of realizing a reduction in cost, an increase in wafer diameter has been made. Here, in a large-diameter wafer such as one having a diameter of 12 or 16 inches, since the strength of the wafer is low, with the current wafer thickness, cracking and the like occur. It is, therefore, difficult to employ the state-of-the-art LSI manufacturing process. If this process is employed, the thickness of Si wafer which will not be fractured becomes as large as 5 mm, and the effective utilization factor of the ingot decreases extremely. Accordingly, brittleness of the Si wafer is the largest problem in increasing the wafer diameter.

In order to decrease the cost, the bare-chip mounting method called LLC connection or FC connection has been developed, as described above. With this method, how to inspect a bare chip poses a problem. Since an inspection process in the bare-chip level has not been established yet, sometimes the semiconductor manufacturer cannot guarantee the defectiveness/non-defectiveness of the chip to the system manufacturer. If a plurality of defective chips are mixedly mounted on the board, the board yield is degraded immediately. A chip not protected by the package cannot be handled well by the system manufacturer. Furthermore, a major problem exists as to how to manufacture a substrate having electrodes with the same precision as that of the small-pitch electrodes of the chips at a low cost. In a substrate employed for LLC connection or FC connection, in order to ensure the reliability of connection, very strict limitations arise concerning not only the positional precision of the electrodes but also the smoothness and warp of the substrate. Then, the number of processes, e.g., the substrate polishing process and a developing/exposure process for circuit formation, that lead to a high cost, increases.

In order to solve the problem of chip protection and inspection process and to increase the mounting efficiency, a concept of chip size package (or chip scale package) is recently proposed and its development has started. According to this concept, a package close to the chip size is fabricated. An Si chip is connected to this package without using leads, and the Si chip together with the package is further connected to a board. According to this method, although the problem of chip protection and inspection is solved, since the board is merely replaced with the chip size package, the problem of whether a package that can realize leadless connection at a low cost still remains unsolved.

SUMMARY OF THE INVENTION

The present invention has been made in view of the above situation of the conventional technique, and has as its object to provide a packaged semiconductor device that serves as a wafer reinforcing member along with an increase in diameter of Si wafers, and enables leadless connection for an LSI chip and a board with a low-cost means while keeping completely the same size as that of the LSI chip which is to be mounted and held, and a method of manufacturing the same.

In order to achieve the above object, according to the first aspect of the present invention, there is provided a packaged semiconductor device comprising an LSI chip, a chip size package integrally bonded to the LSI chip to mount and hold the LSI chip thereon in order to connect an electrode of a board on which the LSI chip is to be mounted and an electrode of the LSI chip to each other, an electrode formed on a surface of the package opposite to a surface thereof which is bonded to the LSI chip, so as to be connected to the electrode of the board, at least one through hole formed to extend through the LSI chip and the package, and a connecting conductor formed to extend through the through hole in order to connect the electrode of the package and the electrode of the LSI package to each other.

In the first aspect, the package is made of glass or a ceramic having a thermal expansion coefficient close to that of an Si wafer constituting the LSI chip. In particular, this material is preferably $SiO_2$-based glass, glass ceramic, alumina, mullite, cordierite, aluminum nitride, or the like.

As an adhesive for bonding the LSI chip and the package to each other, glass is used. In particular, glass having a low softening temperature and capable of maintaining a viscosity at about 1,000° C. is preferable.

Furthermore, the package is preferably formed of a multilayer substrate.

According to the second aspect of the present invention, there is provided a method of manufacturing a packaged semiconductor device having a chip size package integrally formed with an LSI chip on which an integrated circuit is formed, comprising the steps of forming, on a substrate that forms the package, an electrode to be connected to an electrode of a board on which the packaged semiconductor device is to be mounted, bonding an Si wafer to a surface of the substrate opposite to a surface where the electrode is formed, forming a predetermined integrated circuit on a surface of the bonded Si wafer opposite to a bonded surface, measuring a positional relationship between a position of an electrode of the formed integrated circuit and a position of the electrode formed on the package by using a transmission electromagnetic wave, forming at least one through hole at a position set based on the measured positional relationship so as to extend through the LSI chip and the package, forming a conductor that connects the electrode of the integrated circuit and the electrode of the package through the formed through hole, and cutting the package and the Si wafer that are bonded to each other into a predetermined chip size.

In the second aspect, an ultraviolet beam is used as the transmission electromagnetic wave.

In the chip size packaged semiconductor device according to the present invention, since the glass or ceramic multilayer substrate is adhered to the Si wafer in its manufacturing process, its mechanical strength is reinforced.

Regarding electrical connection between Si and glass or ceramic, since the through hole is formed through alignment using the transmission electromagnetic wave, e.g., an ultraviolet beam, even if the positional precision of the electrode of the substrate is degraded to be slightly different from that of the electrode of the LSI, an open defect does not occur due to conductor connection through the through hole.

As described above, according to the present invention, since the glass or ceramic package substrate to be bonded serves as the reinforcing member of the Si wafer, a large-diameter wafer can be used without increasing the thickness. This realizes a low-cost process for a large-diameter wafer. A plurality of silicon wafers can be adhered on a large-size multilayer substrate and the resultant structure can be processed with the process for a large-diameter wafer.

Since the electrode of the Si wafer and the electrode of the package substrate to be connected to the board can be connected to each other with the connecting conductor through the through hole, high positional precision is not required for the electrode unlike in leadless chip connection. Since the minimum distance between the electrodes to be connected to the board can be set larger than that of the LSI chip, the mounting cost can be decreased even though the chip size package is employed. Also, inspection of a chip before mounting is possible. A high-reliability, low-cost chip size packaged semiconductor device can therefore be provided.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF THE PREFERRED EMBODIMENT

Figure 1:
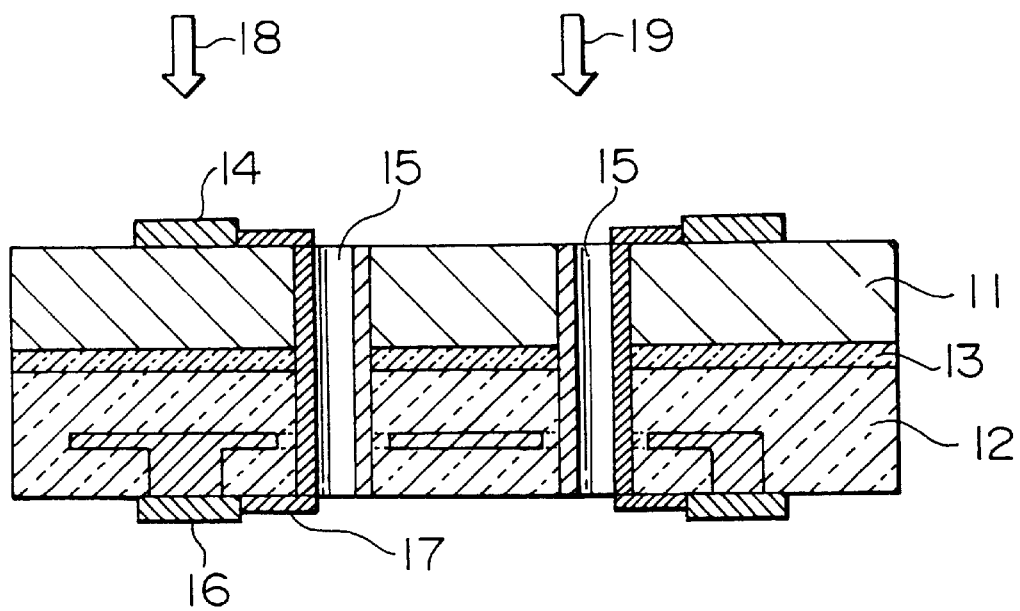
FIG. 1 is a sectional view schematically showing a packaged semiconductor device according to an embodiment of the present invention.
Figure 2:
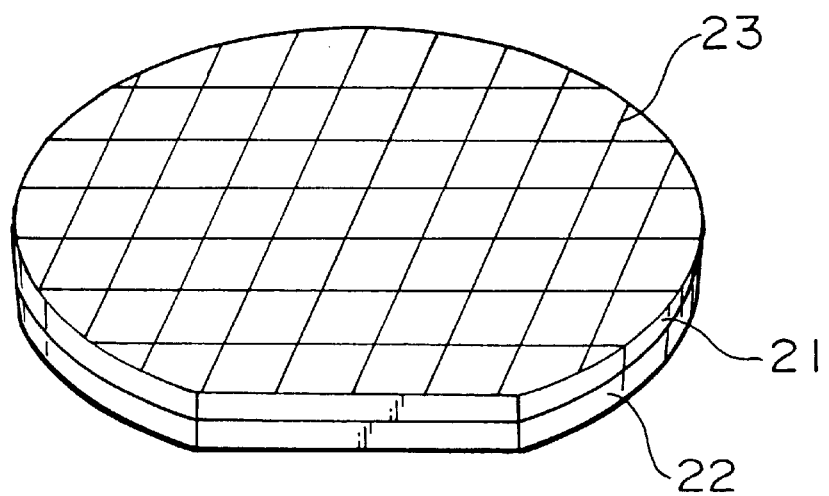
FIG. 2 is a perspective view schematically showing a multilayer substrate to which an Si wafer of the present invention is bonded.
Figure 3:
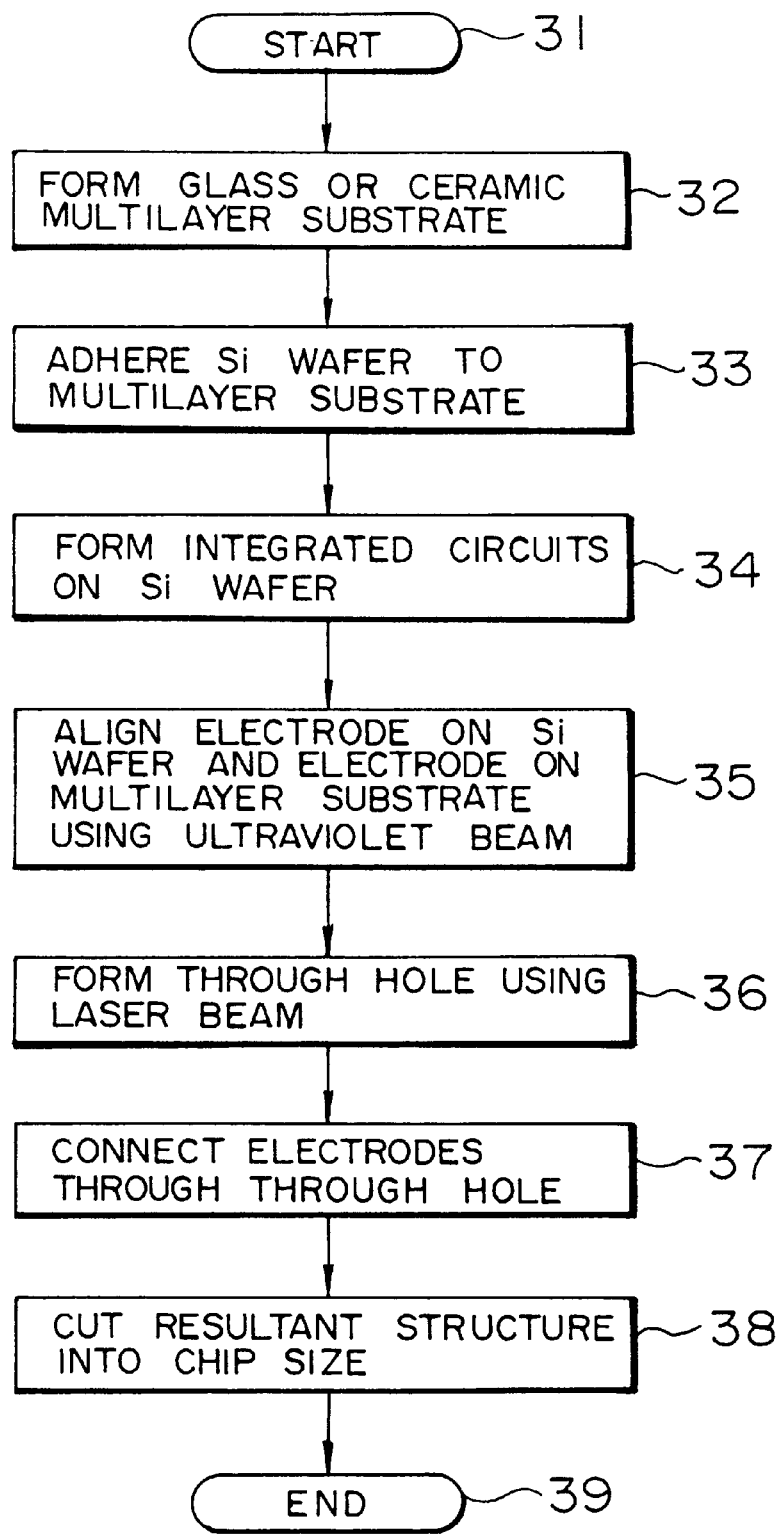
FIG. 3 is a flow chart concerning a method of manufacturing a packaged semiconductor device according to the present invention.
Figure 4:
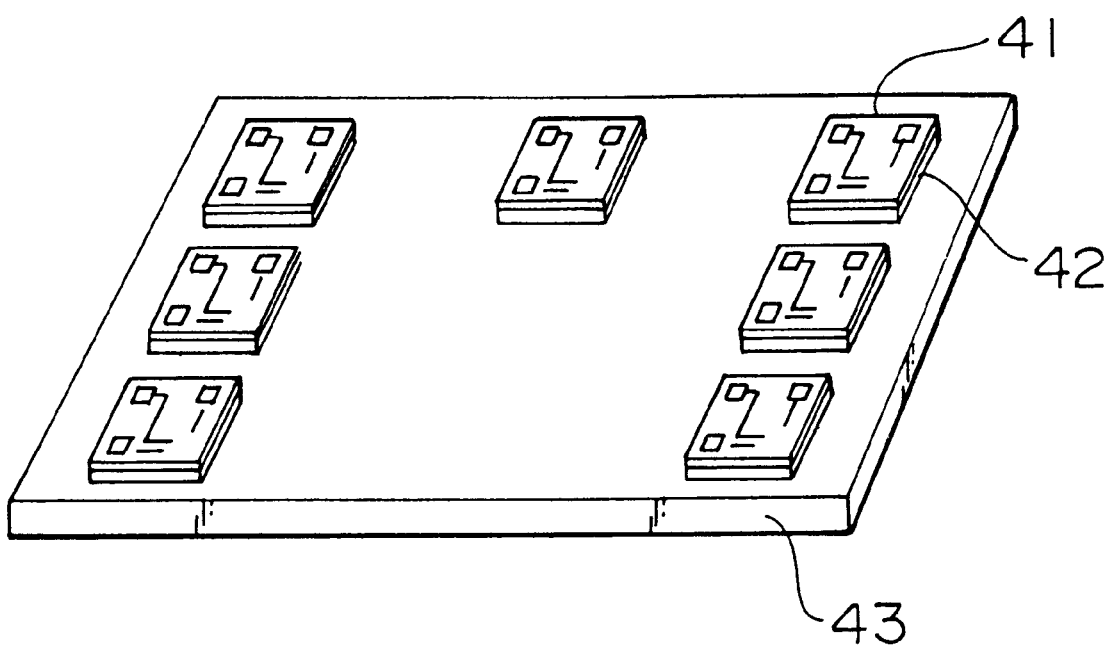
FIG. 4 is a schematic perspective view showing a state wherein packaged semiconductor devices according to the present invention are mounted on a board.

The preferred embodiment of the present invention will be described in detail with reference to the accompanying drawings. FIG. 1 is a schematic sectional view of a packaged semiconductor device according to an embodiment of the present invention. Referring to FIG. 1, reference numeral 11 denotes an LSI chip formed on an Si wafer and divided; 12, a chip size package formed by dividing a multilayer substrate; 13, a glass adhesion layer; 14, an electrode on the LSI chip; 15, through holes; 16, an electrode on the chip size packaged semiconductor; 17, a connecting conductor; 18, an ultraviolet beam; and 19, a laser beam. FIG. 2 is a schematic perspective view of a glass or ceramic multilayer substrate to which the Si wafer of the present invention is bonded. Referring to FIG. 2, reference numeral 21 denotes an Si wafer; 22, a multilayer substrate; and 23, a cutting line. FIG. 3 is a flow chart of a method of manufacturing a packaged semiconductor device according to the present invention. Referring to FIG. 3, reference numerals S31 to S39 denote the respective steps. FIG. 4 is a schematic perspective view showing a state wherein packages 42 of the present invention respectively bonded with the LSI chips 41 are mounted on a board 43.

In the present invention, as shown in FIG. 1, the glass or ceramic chip size package 12 as a multilayer substrate is integrated to the LSI chip 11 as it is completely bonded to the LSI chip 11 through the glass adhesion layer 13. The glass or ceramic multilayer substrate 22 shown in FIG. 2, which is bonded with the Si wafer 21 is divided at the cutting lines 23, thereby fabricating packaged semiconductors of the present invention. The electrode 14 formed on the integrated circuit of the LSI chip 11 is connected to the electrode 16, formed on the package 12 to be connected to the board, with the connecting conductor 17 through the through hole 15.

A method of manufacturing a packaged semiconductor device according to the present invention will be described with reference to the manufacturing process flow chart shown in FIG. 3, and FIGS. 1 and 2.

I. When the process is started (S31), first, the glass or ceramic multilayer substrate 22 serving as the package is fabricated in accordance with the conventional green sheet scheme, and predetermined electric circuits and external electrodes 16 are formed on it. At this time, glass, glass ceramic, aluminum oxide, mullite, cordierite, or aluminum nitride having a thermal expansion coefficient which is close to that of Si is selected (the thermal expansion coefficient of Si is about 3.0 ppm at a temperature of 25 to 1,000° C.) (S32).

II. The glass adhesion layer 13 is interposed between the multilayer substrate 22 and the Si wafer 21, and the resultant structure is heated to melt the glass adhesion layer 13, thereby adhering the multilayer substrate 22 and the Si wafer 21 to each other. If a ceramic having a thermal coefficient which is largely different from that of Si is selected, after the structure is cooled, cracking or the like occurs. The thermal expansion coefficient of the adhesion glass is also preferably an intermediate value between that of Si and that of the material of the multilayer substrate. As the adhesion glass, one having a softening temperature as low as possible must be selected since it is expected to serve as a buffer layer that absorbs the difference in thermal expansion coefficient between Si and the multilayer substrate. Since the structure is subjected to a heating process at about 1,000° C. in the subsequent step of forming circuits on Si, glass that can maintain an appropriate viscosity at this temperature is used. Most organic substances volatilize at 1,000° C. Thus, as the material of this bonding layer, inorganic glass is preferable, but depending on the conditions, an organic substance can be used. In this case, a plurality of Si wafers may be bonded on a single multilayer substrate to be in tight contact with each other (S33).

III. The wafer consisting of the Si wafer 21 and the multilayer substrate 22 which are adhered to each other to be completely integrated with each other in.II is supplied to the normal semiconductor manufacturing process, and predetermined integrated circuits are formed on the Si wafer 21. If the Si wafer alone is used, fractures such as cracking occur due to its brittleness, and the yield is degraded extremely. If the Si wafer is adhered to glass or ceramic, glass or ceramic serves as the reinforcing member. Then, even if the thickness of the Si wafer is not increased, the wafer diameter can be increased to 12 or 16 inches (S34).

IV. A transmission electromagnetic wave 18, e.g., an ultraviolet beam, is transmitted through the integrated wafer to measure the positional relationship between the electrode 14 on the Si wafer and the electrode 16 on the multilayer substrate (S35).

V. Based on the measured positional relationship, the through hole 15 is formed with the laser beam 19 at a predetermined position through which the two electrodes can be connected to each other (S36).

VI. The electrode 14 on the Si wafer and the electrode 16 on the multilayer substrate are connected to each other with the connecting conductor 17 by plating or the like through the through hole 15. As shown in FIG. 1, even if the positional precision of the electrode 14 on the Si wafer somewhat differs from that the electrode 16 on the multilayer substrate, since the electrodes 14 and 16 are connected to each other with the connecting conductor 17 through the through hole 15, an open defect does not occur. In this respect, the present invention is basically different from the conventional manufacture of a leadless connection substrate and package. According to the method of the present invention, in the step of electrically connecting the Si wafer and the multilayer substrate, variations resulting from the respective manufacture surfaces can be absorbed (S37).

VII. The completed wafer in which the Si wafer 21 and the multilayer substrate 22 are bonded to each other is cut and divided by dicing or scribing to obtain the packages 12 having completely the same chip size as that of the LSI chips 11 (S38). The method is thus ended (S39).

The basic difference of the structure of the chip size packaged semiconductor device of the present invention from that of conventional leadless connection will be described. In conventional leadless connection, the LSIs are always mounted with their faces being directed downward, whereas in the present invention, the chips are mounted on the packages with their faces being directed upward. Regarding crystal distortion observed in a method of forming a polysilicon layer on a surface of an Si wafer opposite to a surface where circuits are formed, in the present invention, such distortion does not occur since it is absorbed by the glass adhesion layer.

An example in which the present invention is practiced by using a glass ceramic material will be described. The employed glass ceramic material is a composite of alumina and borosilicate glass having a thermal expansion coefficient of 5.0 ppm. As a conductor, AgPd having a weight ratio of 90/10 is used. A multilayer substrate was fabricated by using this glass ceramic material at the 12-inch wafer level, and an Si wafer was adhered to this substrate with $SiO_2$-ZnO-type glass by heating the structure at a temperature of 1,100° C. The $SiO_2$-ZnO-type glass has a softening temperature of 300° C. and a thermal expansion coefficient of 4.0 ppm.

After circuits are formed on the Si surface, through holes were formed, electrodes on the Si wafer and the electrodes on the glass ceramic substrate were connected to each other by Au plating, and the resultant structure was divided by cutting into chips having a chip size of 10 mm. The number of electrodes per LSI chip was 80, and the minimum electrode-to-electrode distance of the chip was 40 $\mu$m. The minimum electrode-to-electrode distance of the package was set to 150 $\mu$m. FIG. 4 shows a state wherein the electrodes of the packages are connected to the mother board of a printed board through internal wiring of the packages. Even when this structure was subjected to a heat cycle of −45° C. to 125° C. for 500 times, an open short-circuiting defect did not occur.

What we claim is:

1. A packaged semiconductor device comprising:

an LSI chip having an electrode positioned on an upper surface of said LSI chip;

a chip size package integrally bonding to said LSI chip on an opposite surface of said LSI chip electrode, and further connecting an electrode of a board on which said LSI chip is to be mounted and said LSI chip electrode to each other;

an electrode formed on a surface of said package opposite to said surface bonded to said LSI chip, said package surface connecting to said board electrode;

at least one through hole extending through said LSI chip and said package; and a connecting conductor extending through the through hole of said LSI chip and said package and further extending on the upper surface of said LSI chip to a side surface of said LSI chip electrode so as to connect the side surface of said LSI chip electrode and said package electrode to each other.

2. A device according to claim 2, wherein said package is made of a material having a thermal expansion coefficient close to that of an Si wafer constituting said LSI chip.

3. A device according to claim 2, wherein said package is made of glass.

4. A device according to claim 2, wherein said package is made of a ceramic.

5. A device according to claim 3, wherein said package is made of $SiO_2$-based glass.

6. A device according to claim 4, wherein said package is made of glass ceramic.

7. A device according to claim 4, wherein said package is made of alumina.

8. A device according to claim 4, wherein said package is made of mullite.

9. A device according to claim 4, wherein said package is made of cordierite.

10. A device according to claim 4, wherein said package is made of aluminum nitride.

11. A device according to claim 1, wherein said package and said LSI chip are bonded to each other by using glass as an adhesive.

12. A device according to claim 11, wherein the glass serving as the adhesive has a low softening temperature and can maintain a viscosity at about 1,000° C.

13. A device according to claim 1, wherein said package is formed of a multilayer substrate.

* * * * *